United States Patent
Solanki et al.

(10) Patent No.: US 10,319,445 B1
(45) Date of Patent: Jun. 11, 2019

(54) PROGRAMMING UNPROGRAMMED UPPER PAGE DURING LOWER PAGE PROGRAMMING OF MULTI-LEVEL STORAGE CELLS

(71) Applicant: Western Digital Technologies, Inc., San Jose, CA (US)

(72) Inventors: Bhavadip Solanki, Jungadh (IN); Anantharaj Thalaimalai Vanaraj, Bengaluru (IN); Suman Tenugu, Bengaluru (IN); Arun Thandapani, Bengaluru (IN); Piyush Anil Dhotre, Bengaluru (IN); Chittoor Devarajan Sunilkumar, Bengaluru (IN); Dharmaraju Marenhally Krishna, Bengaluru (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/828,417

(22) Filed: Nov. 30, 2017

(51) Int. Cl.
| | | |
|---|---|---|
| G11C 16/10 | (2006.01) | |
| G11C 16/34 | (2006.01) | |
| G06F 12/02 | (2006.01) | |
| G11C 16/04 | (2006.01) | |
| G11C 11/56 | (2006.01) | |
| G11C 16/26 | (2006.01) | |

(52) U.S. Cl.
CPC .......... *G11C 16/10* (2013.01); *G06F 12/0246* (2013.01); *G11C 11/5628* (2013.01); *G11C 16/0483* (2013.01); *G11C 16/26* (2013.01); *G11C 16/3459* (2013.01)

(58) Field of Classification Search
CPC . G11C 16/26; G11C 16/3459; G11C 2216/14; G11C 2216/16; G11C 2013/0085; G05B 2219/24137
See application file for complete search history.

(56) References Cited

U.S. PATENT DOCUMENTS

| | | | | |
|---|---|---|---|---|
| 8,885,418 | B1 * | 11/2014 | Chung | G11C 16/0483 365/185.03 |
| 8,913,411 | B2 * | 12/2014 | Abraham | G11C 11/5628 365/12 |
| 2010/0318839 | A1 * | 12/2010 | Avila | G06F 12/0802 714/5.11 |

(Continued)

*Primary Examiner* — Mushfique Siddique
(74) *Attorney, Agent, or Firm* — Kunzler Bean & Adamson, PC

(57) ABSTRACT

Apparatuses, systems, methods, and computer program products for programming an unprogrammed upper page based on lower page programming are disclosed. An apparatus includes a non-volatile storage device and a controller. A controller includes a data component that is configured to receive a write request for a first page of a set of multi-level storage cells of a non-volatile storage device. A set of multi-level storage cells includes a first page and a second page. A controller includes a page component that is configured to determine that a write request does not comprise data for at least a portion of a second page of a set of multi-level storage cells. A controller includes a write component that is configured to program at least a portion of a second page of a set of multi-level storage cells with data of a first page of a set of multi-level storage cells.

19 Claims, 10 Drawing Sheets

(56) References Cited

U.S. PATENT DOCUMENTS

| | | | |
|---|---|---|---|
| 2013/0219107 A1* | 8/2013 | Lee | G11C 16/10 |
| | | | 711/103 |
| 2014/0095770 A1* | 4/2014 | Huang | G11C 11/5642 |
| | | | 711/103 |
| 2014/0254263 A1* | 9/2014 | Avila | G11C 16/10 |
| | | | 365/185.03 |
| 2015/0161001 A1* | 6/2015 | Cometti | G06F 11/1072 |
| | | | 714/773 |
| 2015/0324282 A1* | 11/2015 | Seekins | G06F 11/0751 |
| | | | 714/6.11 |
| 2016/0011806 A1* | 1/2016 | Zaltsman | G06F 3/0619 |
| | | | 711/166 |
| 2016/0216910 A1* | 7/2016 | Phan | G11C 11/5628 |

* cited by examiner

PROGRAMMING UNPROGRAMMED UPPER PAGE DURING LOWER PAGE PROGRAMMING OF MULTI-LEVEL STORAGE CELLS

TECHNICAL FIELD

The present disclosure, in various embodiments, relates to computer storage devices and more particularly relates to programming an unprogrammed upper page of a storage device based on the lower page programming.

BACKGROUND

Storage devices may include storage elements that comprise multiple levels or pages. Depending on the data that is being stored and the use case of the storage device, only the lower page may initially be programmed. The upper pages may be programmed at a later time. When an upper page is programmed after the lower page has been programmed, data that is stored in the lower page may be lost if there is an issue programming the upper page.

SUMMARY

Various embodiments are disclosed, including apparatuses, systems, methods, and computer program products for programming an unprogrammed upper page based on lower page programming. In one embodiment, an apparatus includes a non-volatile storage device and a controller. A controller, in some embodiments, includes a data component that is configured to receive a write request for a first page of a set of multi-level storage cells of a non-volatile storage device. A set of multi-level storage cells may include a first page and a second page. A controller, in further embodiments, includes a page component that is configured to determine that a write request does not comprise data for at least a portion of a second page of a set of multi-level storage cells. A controller, in certain embodiments, includes a write component that is configured to program at least a portion of a second page of a set of multi-level storage cells with data of a first page of a set of multi-level storage cells.

An apparatus, in various embodiments, includes means for receiving first data of a write request for storage elements of a non-volatile storage medium. Storage elements may include a lower page and an upper page. An apparatus, in further embodiments, includes means for determining that first data is sized such that at least a portion of an upper page of storage elements is not programmed with at least a portion of the first data in response to programming a lower page of the storage elements with at least a portion of the first data. In some embodiments, an apparatus includes means for programming at least a portion of an unprogrammed upper page of storage elements with second data.

A system, in one embodiment, includes a non-volatile memory device comprising a plurality of erase blocks and a controller for the non-volatile memory device. In certain embodiments, a controller performs operations for programming a lower page and an upper page of a plurality of memory elements of a non-volatile memory device with data of a write request. In various embodiments, a controller performs operations for determining at least a portion of a plurality of memory elements where an upper page is not programmed with data and that corresponds to a portion of the plurality of memory elements where a lower page is programmed with the data. In one embodiment, a controller performs operations for programming an upper pages of a plurality of memory elements that are not programmed with the same data used to program corresponding lower pages of the plurality of memory elements.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
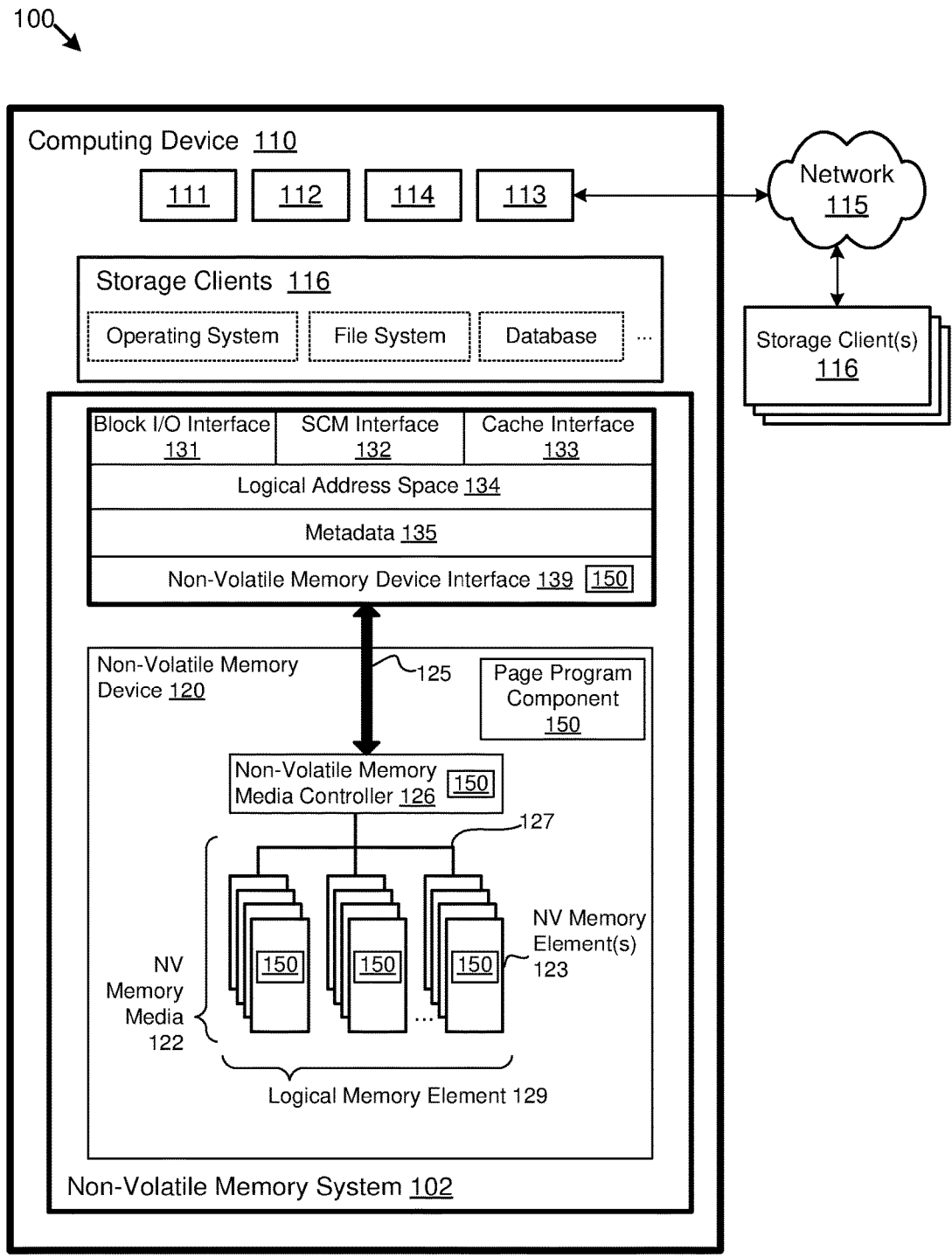
FIG. 1A is a schematic block diagram illustrating one embodiment of a system for programming an unprogrammed upper page based on lower page programming.

Aspects of the present disclosure may be embodied as an apparatus, system, method, or computer program product. Accordingly, aspects of the present disclosure may take the form of an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodiment on one or more non-transitory computer-readable storage media storing computer-readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer-readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

In addition, as used herein, the term "set" can mean "one or more," unless expressly specified otherwise. The term "sets" can mean multiples of or a plurality of "one or mores," "ones or more," and/or "ones or mores" consistent with set theory, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 including a page program component 150 for a controller 126 of a non-volatile memory device 120. The page program component 150 may be part of and/or in communication with a controller 126, a non-volatile memory element 123, a device driver, or the like. The page program component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer-readable storage medium 114. The computer-readable storage medium 114 may comprise executable instructions configured to cause the computing device 110 (e.g., processor 111) to perform steps of one or more of the methods disclosed herein. Alternatively, or in addition, the page program component 150 may be embodied as one or more computer-readable instructions stored on the non-transitory storage medium 114.

The non-volatile memory system 102, in the depicted embodiment, includes a page program component 150. The page program component 150, in one embodiment, is configured to program an upper page of a non-volatile storage device with lower page data during lower page programming. In certain embodiments, the page program component 150 receives a write request for at least a first (lower) page of a set of multi-level ("MLC") storage cells of the non-volatile memory device, determines that the write request does not include data for at least a portion of a second (upper) page of the set of MLC storage cells, and programs the at least a portion of the second page of the set of MLC storage cells with data of the at least a first page of the set of MLC storage cells.

In one embodiment, the page program component 150 may comprise logic hardware of one or more non-volatile memory devices 120, such as a controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the page program component 150 may comprise executable software code, such as a device driver or the like, stored on the computer-readable storage medium 114 for execution on the processor 111. In a further embodiment, the page program component 150 may include a combination of both executable software code and logic hardware.

In one embodiment, the page program component 150 is configured to receive I/O requests from a device driver or other executable application via a bus 125 or the like. The page program component 150 may be further configured to transfer data to/from a device driver and/or storage clients 116 via the bus 125. Accordingly, the page program component 150, in some embodiments, may comprise and/or be in communication with one or more direct memory access (DMA) modules, remote DMA modules, bus controllers, bridges, buffers, and so on to facilitate the transfer of memory/storage requests and storage operations of associated program data. In another embodiment, the page program component 150 may receive storage requests as an API call from a storage client 116, as an IO-CTL command, or the like.

According to various embodiments, a controller 126 in communication with one or more page program components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more memory elements 123 of non-volatile memory media 122, which may include, but is not limited to: random access memory (RAM), resistive RAM (ReRAM), Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape, etc.), optical storage media, and/or the like, among other devices that are possible and contemplated herein. The one or more memory elements 123 of non-volatile memory media 122, in certain embodiments, comprise storage class memory (SCM).

While legacy technologies, such as NAND flash, may be block and/or page addressable, storage class memory, in one embodiment, is byte addressable. In further embodiments, SCM may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, and/or the like. Further, the non-volatile memory device 120, in various embodiments, may comprise a non-volatile recording device, a non-volatile memory device, a non-volatile storage device, and/or the like.

The non-volatile memory media 122 may comprise one or more non-volatile memory elements 123, which may include, but are not limited to: chips, packages, planes, die, and/or the like. A controller 126 may be configured to manage data operations on the non-volatile memory media 122, and may comprise one or more processors, programmable processors (e.g., FPGAs), ASICs, micro-controllers, or the like. In some embodiments, the controller 126 is configured to store data on and/or read data from the non-volatile memory media 122, to transfer data to/from the non-volatile memory device 120, and so on.

The controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library.

A device driver may be further configured to provide a cache interface 133 for caching data using the non-volatile memory system 102. A device driver may further comprise a non-volatile memory device interface 139 that is configured to transfer data, commands, and/or queries to the controller 126 over a bus 125, as described above.

Figure 1B:
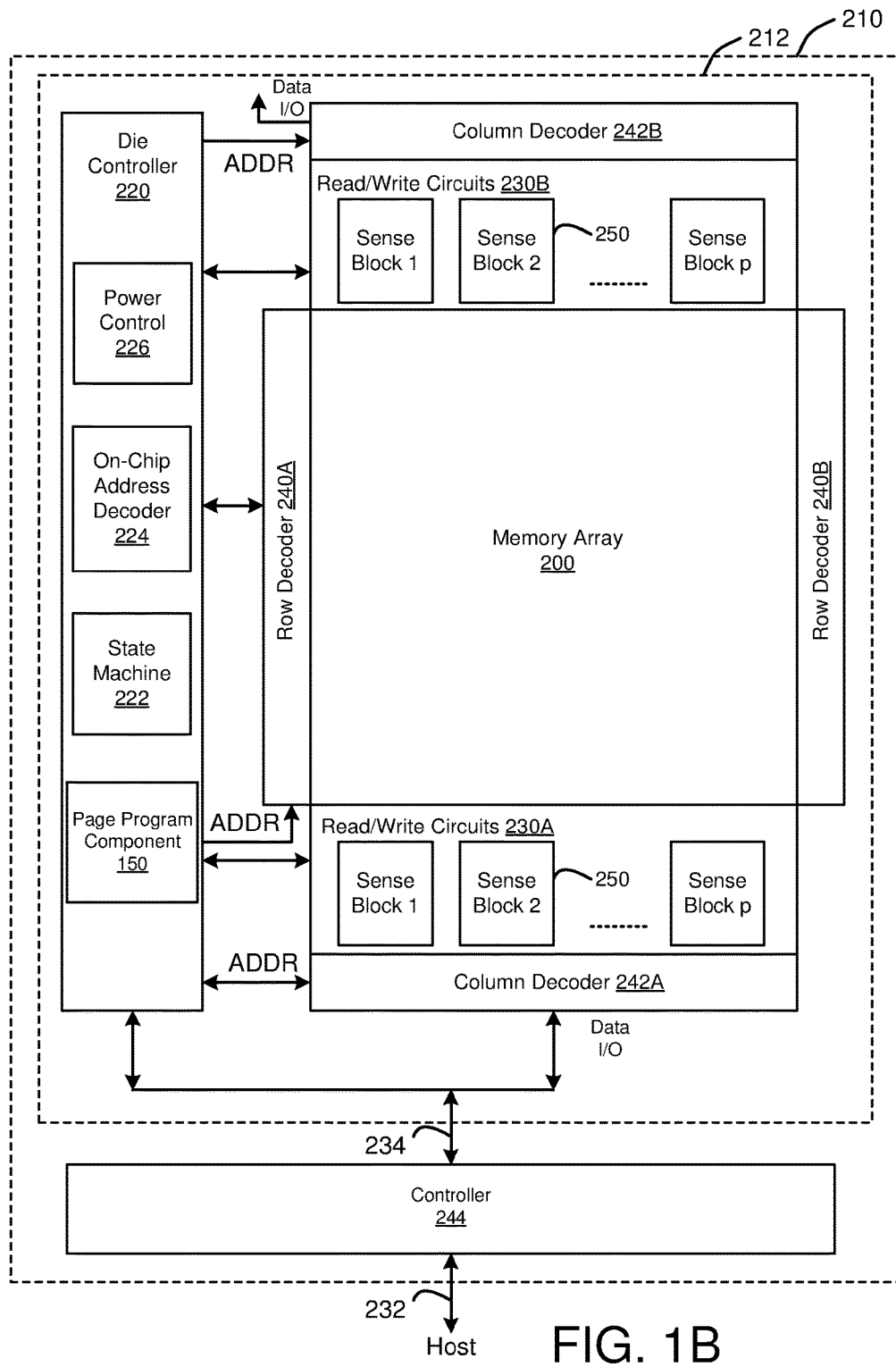
FIG. 1B is a schematic block diagram illustrating another embodiment of a system for programming an unprogrammed upper page based on lower page programming.

FIG. 1B illustrates an embodiment of a non-volatile storage device 210 that may include one or more memory die and/or chips 212. Memory die 212, in some embodiments, includes an array (e.g., two-dimensional (2D), three dimensional (3D), etc.) of memory cells 200, die controller 220, and read/write circuits 230A/230B. In one embodiment, access to the memory array 200 by various peripheral circuits is implemented in a symmetric fashion, on opposite sides of the array, so that the densities of access lines and circuitry on each side are reduced by half. The read/write circuits 230A/230B, in a further embodiment, can include multiple sense blocks 250 that allow a page of memory cells to be read and/or programmed in parallel.

The memory array 200, in various embodiments, is addressable using word lines via row decoders 240A/240B and using bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a page program component 150, a state machine 222, and an on-chip address decoder 224. In one embodiment, the state machine 222 comprises at least a portion of the page program component 150. In a further embodiment, the controller 244 comprises at least a portion of the page program component 150. In various embodiments, one or more of the sense blocks 250 comprises at least a portion of the page program component 150. The page program component(s) 150 discussed with reference to FIG. 1B may be similar to the page program component(s) 150 discussed with reference to FIG. 1A.

The state machine 222, in one embodiment, provides chip-level control of memory operations. The on-chip address decoder 224 provides an address interface to convert between the address that is used by the host or a memory controller to the hardware address used by the decoders 240A, 240B, 242A, and 242B. In certain embodiments, the state machine 222 includes an embodiment of the page program component 150. The page program component 150, in certain embodiments, is embodied as software in a device driver, hardware in a controller 244, and/or hardware in a die controller 220 and/or state machine 222. In one embodiment, one or any combination of die controller 220, page program component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
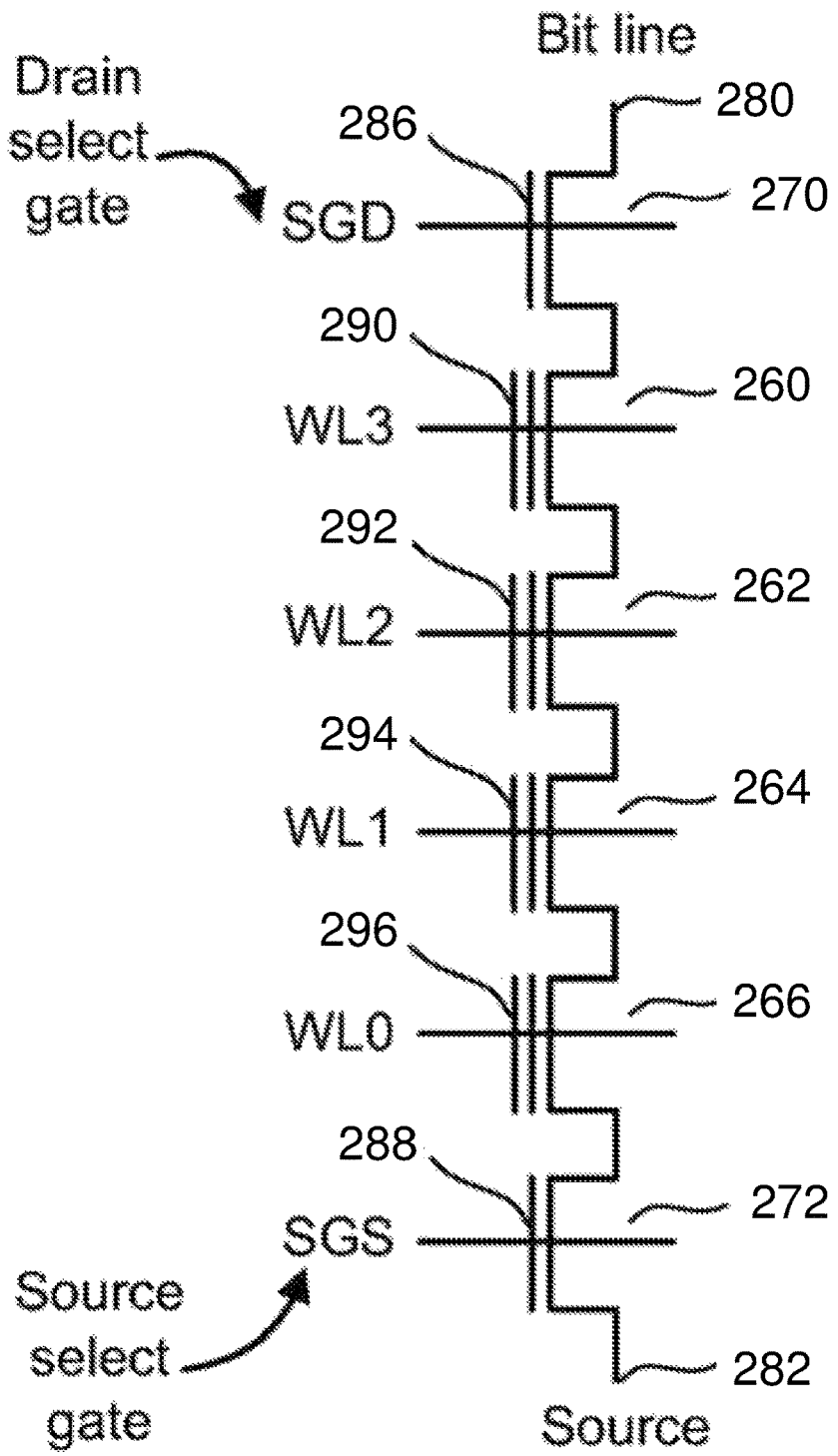
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, and 266 connected in series and located between a first select transistor 270 and a second select transistor 272. In some embodiments, a transistor 260, 262, 264, and 266 includes a control gate and a floating gate. A control gate 290, 292, 294, and 296, in one embodiment, is connected to, or comprises a portion of, a word line. In a further embodiment, a transistor 260, 262, 264, and 266 is a storage element, storage cell, or the like, also referred to as a memory cell. In some embodiments, a storage element may include multiple transistors 260, 262, 264, and 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, and 266 in the NAND string. The NAND string, in some embodiments, may include some storage elements 260, 262, 264, and 266 that have been programmed and some storage elements 260, 262, 264, and 266 that have not been programmed. As described in more detail below, the page program component 150 controls whether portions of a storage device, such as a NAND string, are used for memory and/or storage operations.

Figure 3:
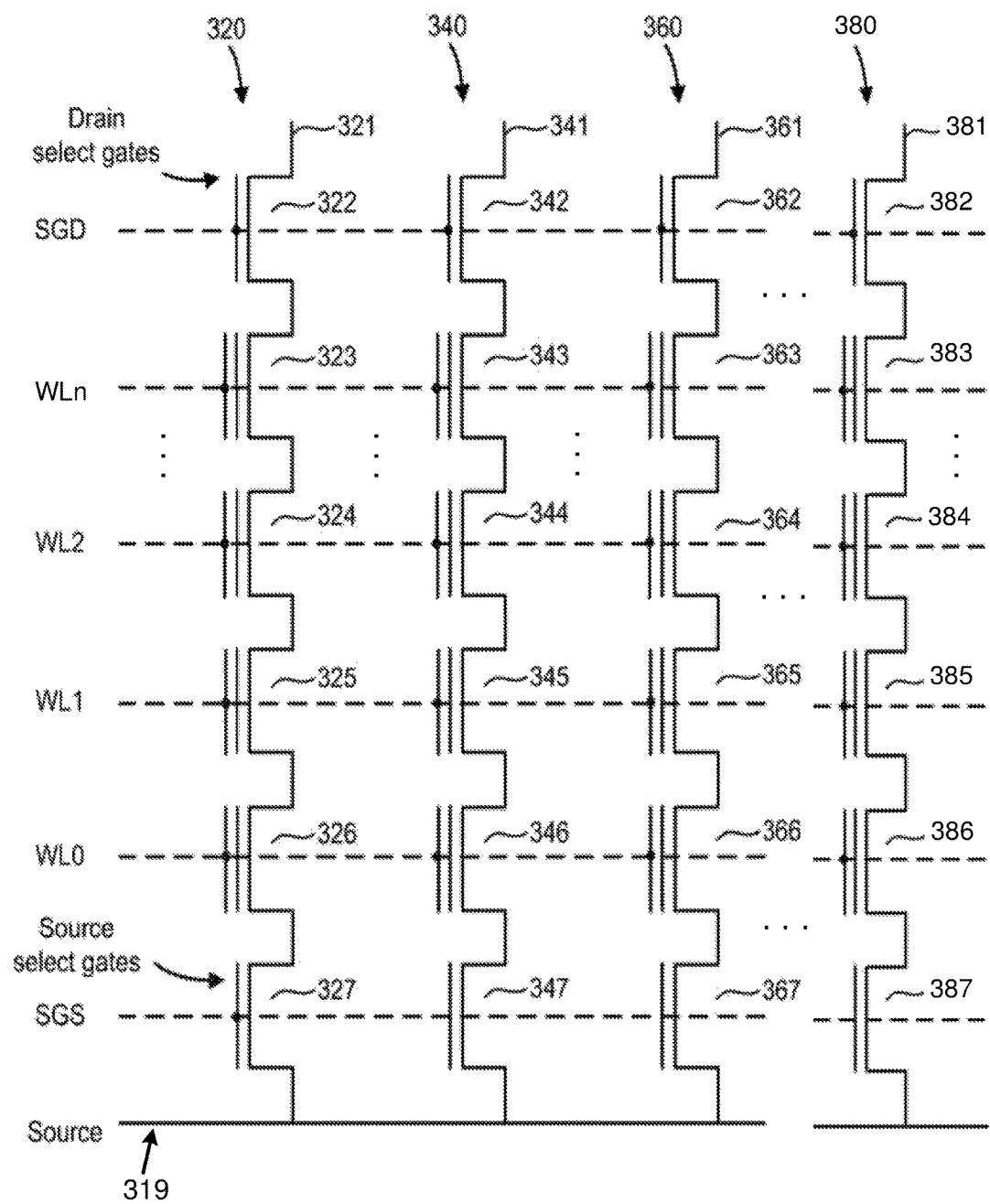
FIG. 3 is a schematic block diagram illustrating one embodiment of an array of storage cells.

FIG. 3 is a circuit diagram depicting a plurality of NAND strings 320, 340, 360, and 380. The architecture for a flash memory system using a NAND structure may include several NAND strings 320, 340, 360, and 380. For example, FIG. 3 illustrates NAND strings 320, 340, 360, and 380 in a memory array 200 that includes multiple NAND strings 320, 340, 360, and 380. In the depicted embodiment, each NAND string 320, 340, 360, and 380 includes drain select transistors 322, 342, 362, and 382, source select transistors 327, 347, 367, and 387, and storage elements 323-326, 343-346, 363-366, and 383-386. While four storage elements 323-326, 343-346, 363-366, and 383-386 per NAND string 320, 340, 360, and 380 are illustrated for simplicity, some NAND strings 320, 340, 360, and 380 can include any number of storage elements (e.g., thirty-two, sixty-four, or the like storage elements, among other storage elements that are possible and contemplated herein).

NAND strings 320, 340, 360, and 380, in one embodiment, are connected to a source line 319 by source select transistors 327, 347, 367, and 387. A selection line SGS may be used to control the source side select transistors. The various NAND strings 320, 340, 360, and 380, in one embodiment, are connected to bit lines 321, 341, 361, 381 by drain select transistors 322, 342, 362, and 382. The drain select transistors 322, 342, 362, and 382 may be controlled by a drain select line SGD. In some embodiments, the select lines do not necessarily need to be in common among the NAND strings 320, 340, 360, and 380; that is, different select lines can be provided for different NAND strings 320, 340, 360, and 380.

As described above, each word line WL0-WLn comprises one or more storage elements 323-383, 324-384, 325-385, and 326-386. In the depicted embodiment, each bit line 321, 341, 361, 381 and the respective NAND string 320, 340, 360, and 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, and 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, and 326-386.

In one embodiment, each storage element 323-326, 343-346, 363-366, and 383-386 is configured to store data. For example, when storing one bit of digital data, the range of possible threshold voltages ("VTH") of each storage element 323-326, 343-346, 363-366, and 383-386 may be divided into two ranges that are assigned logical data "1" and "0." In one example of a NAND type flash memory, the VTH may be negative after the storage elements 323-326, 343-346, 363-366, and 383-386 are erased, and defined as logic "1." In one embodiment, the VTH after a program operation is positive and defined as logic "0."

When the VTH is negative and a read is attempted, in some embodiments, storage elements 323-326, 343-346, 363-366, and 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, and 326-386 may also store multiple levels of information, for example, multiple bits of digital data. In such an embodiment, the range of VTH value is divided into the number of levels of data. For example, if four levels of information can be stored in each storage element 323-326, 343-346, 363-366, and 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, and 383-386 and the threshold voltage ranges of the storage elements 323-326, 343-346, 363-366, and 383-386 depends upon the data encoding scheme adopted for the storage elements 323-326, 343-346, 363-366, and 383-386.

In some embodiments, portions of the storage elements 323-326, 343-346, 363-366, and 383-386 may be defective. In such an embodiment, the latch assignment component 150 may manage which portions of the storage elements 323-326, 343-346, 363-366, and 383-386 are used for operations.

Figure 4:
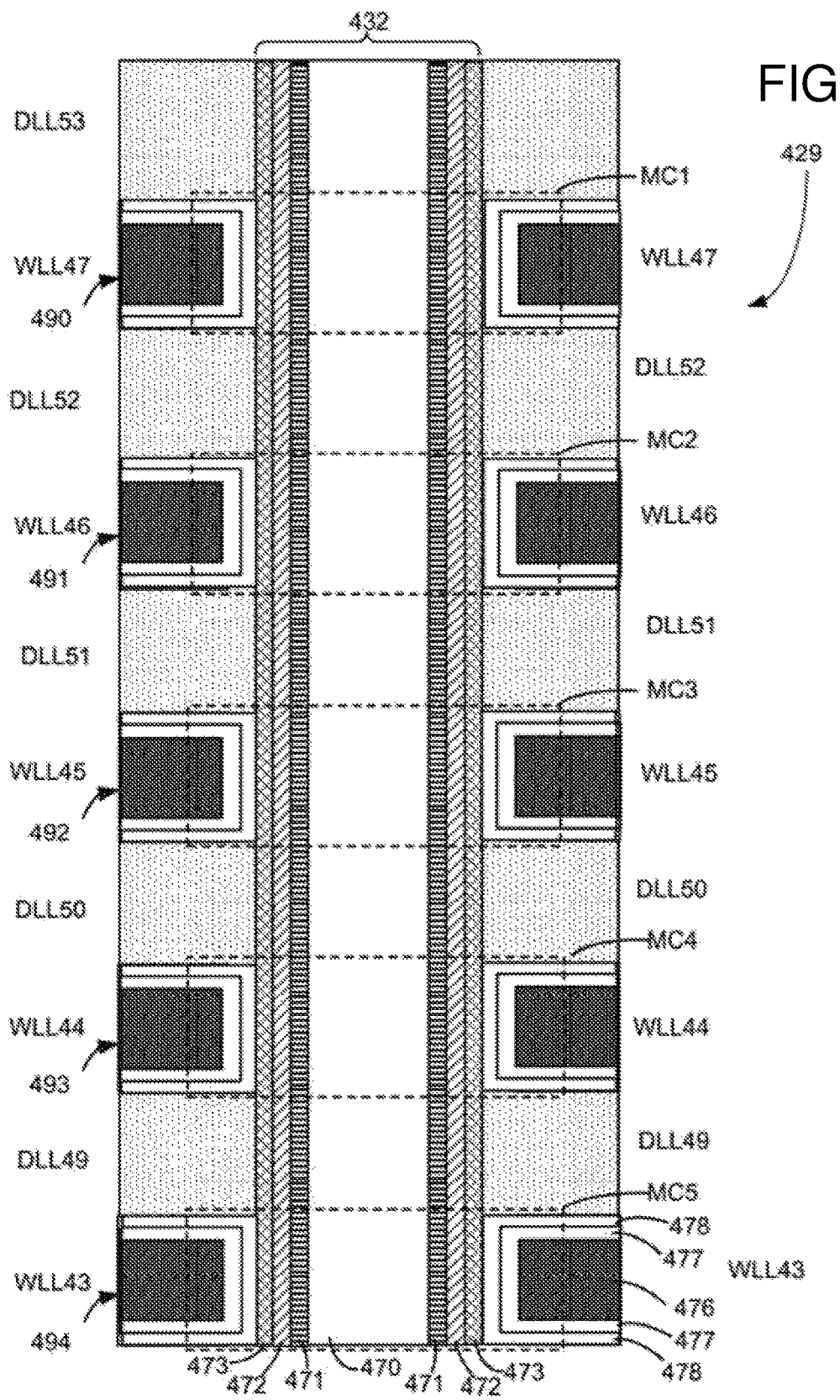
FIG. 4 is a schematic block diagram illustrating one embodiment of a three-dimensional (3D), vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge-trapping layer 473, such as (for example) Silicon Nitride. Other materials and/or structures can also be used. That is, the technology discussed herein is not limited to any particular material and/or structure.

As shown, FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge-trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide ($SiO_2$) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge-trapping layer 473 that is associated with the memory cell. These electrons are drawn into the charge-trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
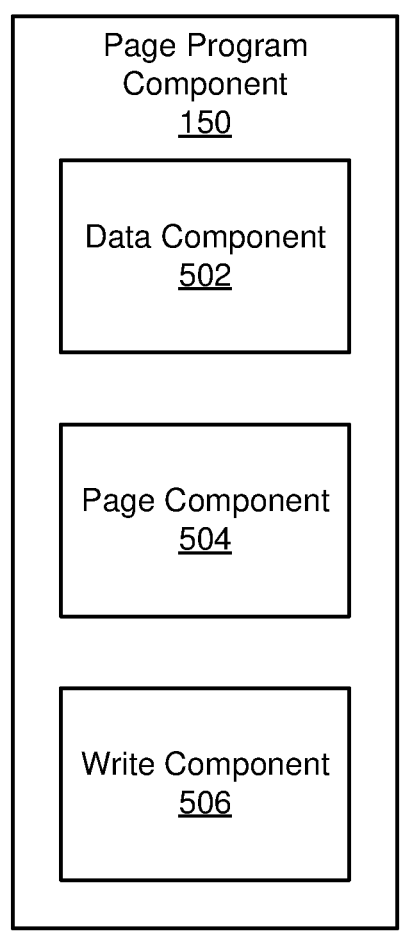
FIG. 5 is a schematic block diagram illustrating one embodiment of a page program component for programming an unprogrammed upper page based on lower page programming.

FIG. 5 is a schematic block diagram illustrating one embodiment of a page program component 150 for programming an unprogrammed upper page based on lower page programming. The page program component 150, in one embodiment, includes one or more of a data component 502, a page component 504, and a write component 506, which are described in more detail below.

The data component 502, in one embodiment, is configured to receive a write request for at least a first page of a set of multi-level (MLC) storage cells, storage elements, memory elements, and/or the like of the non-volatile storage device 120. In certain embodiments, the set of MLC storage cells includes at least a first page and a second page, otherwise known herein as a lower page and an upper page, respectively. As used herein, MLC storage cells are memory elements that are capable of storing more than a single bit of information, compared to single-level (SLC) storage cells which can only store one bit per memory element. MLC storage cells may refer to memory cells that store two bits per memory element; however MLC storage cells may refer to memory cells that can store three bits per memory element (a.k.a. triple-level cells), four bits per memory element (a.k.a. quad-level cells), and so on.

As used herein, the first or lower page of a memory element may refer to the first bit that is stored in an MLC storage cell and/or a logical page comprising the first bits from a plurality of MLC storage cells, and the second or upper page of the memory element refers to the second bit that is stored in the MLC storage cell and/or a logical page comprising the second bits from the plurality of MLC storage cells. Thus, in an MLC storage cell that stores two bits of information, e.g., "01", the lower page may refer to the first bit, "0", and the upper page may refer to the second bit "1". Storage elements that are capable of storing more than two bits of information, in one embodiment, may include a lower page, one or more intermediate pages, and an upper page.

Figure 7A:
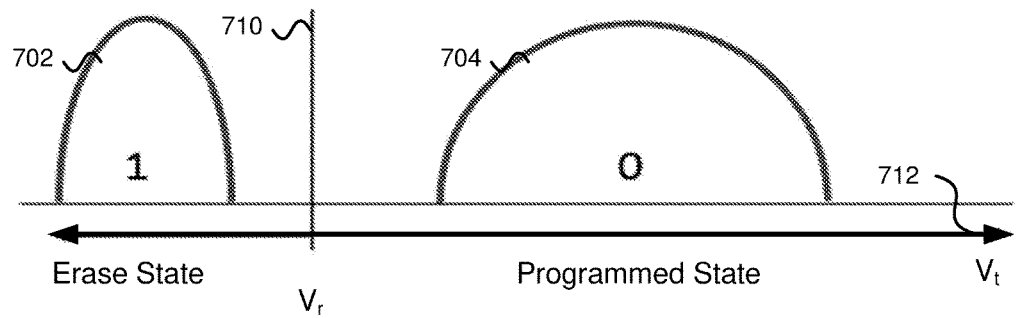
FIG. 7A is a diagram illustrating one embodiment of a voltage range for a storage cell.
Figure 7B:
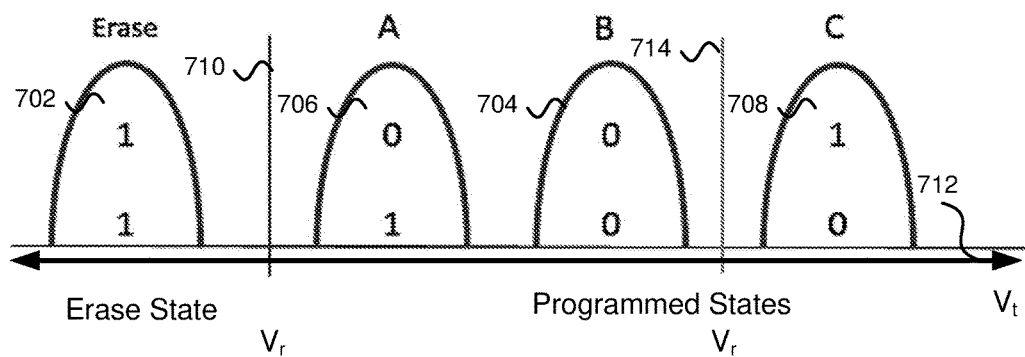
FIG. 7B is a diagram illustrating one embodiment of a voltage range for a storage cell.
Figure 7C:
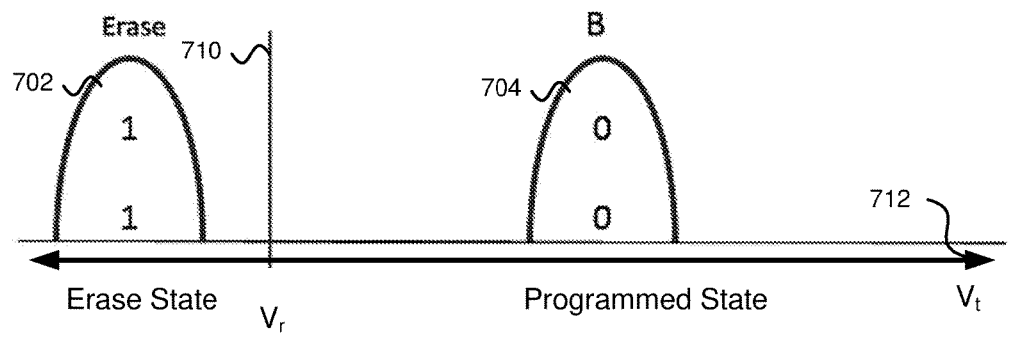
FIG. 7C is a diagram illustrating one embodiment of a voltage range for a storage cell.

In some embodiments, a two-pass programming scheme is used to program an MLC storage element that stores two bits of information. For instance, a first programming pass programs the lower page bit of the MLC storage element, and then a second programming pass on the same MLC storage element programs the upper page bit without resetting the lower page bit. For example, if the information being stored in the MLC storage elements is "01", the first programming pass may program the lower page bit to "0", and then the second programming pass may program the upper page bit to "1". FIGS. 7A-7C, described below, illustrate the programming states for an MLC storage element storing two bits of information.

In some embodiments, the page component 504 determines that the data that the data component 502 receives to service the write request may not include data for at least a portion of the second page of one or more MLC storage elements. For instance, the data may have a fixed chunk size such that only a portion of upper page bits for a set of MLC storage elements is programmed, leaving some upper page bits unprogrammed while their corresponding lower page bits are programmed. In other words, the lower page bits of some MLC storage elements may be programmed with data while the corresponding upper page bits are left unprogrammed.

The page component 504, therefore, may determine that the data of the write request does not include data for one or more upper pages of MLC storage elements according to the characteristics of the data being programmed, e.g., the size of the data being written. In some embodiments, the page component 504 may determine that the data of the write request does not include data for one or more upper pages of MLC storage elements by scanning the MLC storage elements after the data is written to the MLC storage elements to determine whether the upper pages of the MLC storage elements have been programmed. In certain embodiments, the page component 504 may determine that the data of the write request does not include data for one or more upper pages of MLC storage elements by tracking which MLC storage elements only contain programmed lower pages as the data is written to the MLC storage elements.

In one embodiment, the write component 506 is configured to program the second page of an MLC storage element with data of the first page of the MLC storage element when, while, during, in response to, after, or the like the first page of the MLC storage element is programmed. For example, if the page component 504 determines that the data being written to a set of MLC storage elements will leave one or more of the MLC storage elements with only a lower page programmed, the write component 506 may program the upper page with data of the lower page, e.g., with the same bit value as the lower page (such that the MLC storage elements store either "00" or "11"), during or in response to the lower page being programmed, which improves upon conventional storage systems that utilize MLC storage elements.

In conventional storage systems, when data for an upper page of an MLC storage element that only contains lower page data is being programmed to the unprogrammed upper page of the MLC storage element, the lower page data may need to be backed-up or otherwise written to a different memory area, e.g., a scratchpad memory location prior to programming the upper page because the lower page data may otherwise be lost, e.g., if the upper page program fails. For instance, as shown in FIG. 7A, when only lower page data is stored in an MLC storage element, the voltage range or distribution for the lower page data is much wider (similar to an SLC storage element) than when both the lower and upper pages are programmed, as illustrated in FIG. 7B. Accordingly, when the upper page is subsequently programmed, the voltage range or distribution is narrowed, which may cause lower page data to be lost unless it is otherwise backed-up and restored when the upper page is programmed and the upper page program fails. Backing up the lower page data of previously programmed MLC storage elements when the upper pages of the MLC storage elements are subsequently programmed at a later time may cause increased overhead, increased write amplification, increased use of scratchpad memory, and/or increased program/erase cycles (e.g., increased wear) on the non-volatile storage device 120, while reducing throughput and/or performance of the non-volatile storage device 120.

In one embodiment, some original equipment manufacturer (OEM) applications may have frequent write abort scenarios. For example, automobile applications may have scenarios where write aborts for OEM applications are frequent due to voltage droop caused by noise interference or multiple cranks to start the automobile in cold environments. These situations may cause sudden power loss to the automobile sub-systems, which consequently may cause write aborts for OEM applications. If a stand-alone upper page program of an MLC storage element fails during one of these situations, the previously written lower page data may be lost.

Unlike conventional storage systems, the page program component 150 described herein programs the upper page of an MLC storage element that would otherwise not be programmed during or in response to the lower page of the MLC storage element being programmed such that the lower page data is not lost when the upper page is programmed at a later time, and the upper page program fails. Thus, even if a stand alone upper page program fails, the lower page data is not lost and remains available for subsequent read operations.

Figure 6:
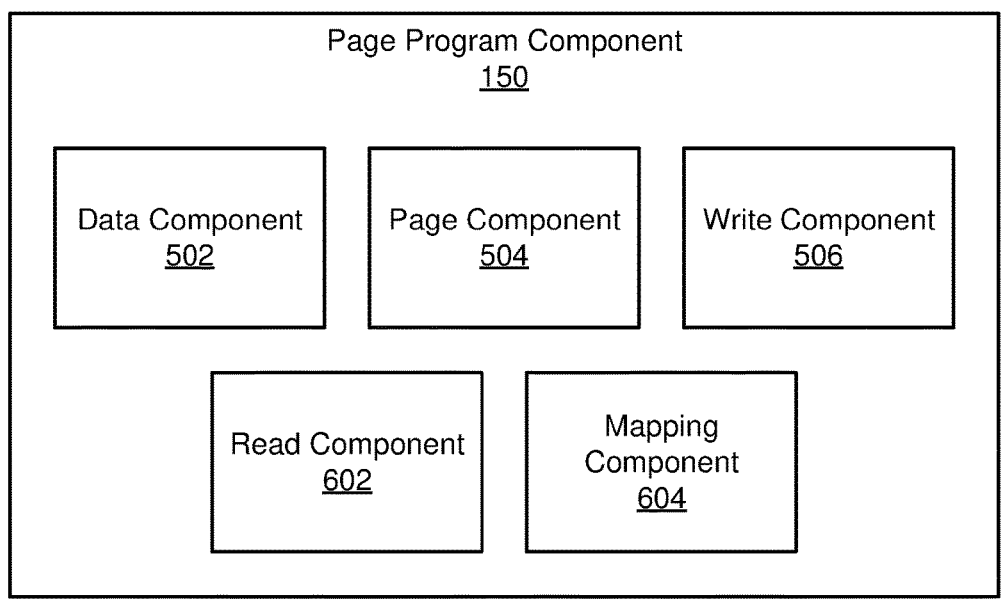
FIG. 6 is a schematic block diagram illustrating one embodiment of another page program component for programming an unprogrammed upper page based on lower page programming.

FIG. 6 is a schematic block diagram illustrating one embodiment of a page program component 150 for programming an unprogrammed upper page based on lower page programming. The page program component 150, in one embodiment, includes one or more of a data component 502, a page component 504, and a write component 506, which may be substantially similar to the data component 502, the page component 504, and the write component 506 described above with reference to FIG. 5. Furthermore, the page program component 150 of FIG. 6 may include a read component 602 and/or a mapping component 604, which are described in more detail below.

In one embodiment, the read component 602 is configured to receive a read request for a lower page of an MLC storage element. For instance, the read request may be for the lower page bits for a set of MLC storage elements. In certain embodiments, the read component 602 services a read request for the lower page of an MLC storage cell even if a previous program of the upper page of the MLC storage element fails. For example, the data component 502 may receive a stand-alone write request for an upper page of an MLC storage cell, which already has its lower page programmed. In conventional storage systems, as described above, performing a stand-alone upper page program may cause previously-programmed lower page data to be lost due to the change in cell distribution of the MLC storage element.

However, unlike conventional storage systems, the page program component 150 ensures that when the data component 502 receives the write request for the upper page program, and the data component 504 detects that the attempt to write the data to the upper page of the MLC storage element failed, the read component 602 is still able to service a read request from the lower page of the MLC storage element even though the upper page program failed. As described above, the page program component 150 ensures that the lower page data is not lost when the upper page program fails because the upper page was already programmed with data of the lower page when a stand-alone lower page program was performed, which sets up at least a portion of the cell distributions for the MLC storage cell.

In certain embodiments, the read component 602 receives a read request for the upper page of an MLC storage element. In such an embodiment, the read component 602 may determine whether the lower page contains the same information, e.g., bit value, as the upper page, and if so, services the read request from the lower page instead of the upper page. In one embodiment, servicing a read request for the upper page from the lower page leads to fewer read errors because the read voltage threshold for the lower page is lower, and takes less time than an upper page read because only one voltage threshold has to be checked instead of two.

In further embodiments, the read component 602 receives a read request for a lower page of an MLC storage element.

In one embodiment, if the read component 602 determines that the lower page read fails, the read component 602 determines whether the information, e.g., bit value, in the upper page of the MLC storage element is the same as the information in the lower page of the MLC storage element, and if so, services the read request from the upper page of the MLC storage element. In this manner, even if the lower page read fails, the read request may be serviced from the upper page as long as the upper page has the same data as the lower page.

In one embodiment, the mapping component 604 is configured to maintain a mapping, list, data store, table, record, and/or the like of MLC storage elements that have an upper page that was programmed at the same time, on in response to, the lower page of the MLC storage elements being programmed. For instance, the mapping component 604 may maintain a mapping of lower pages to corresponding upper pages that are programmed with data of the lower pages when the lower pages are programmed. In certain embodiments, the mapping component 604 may maintain the mapping in a flash translation layer (FTL) of the non-volatile memory device 120. As used herein, the FTL may be a component of the non-volatile memory media controller 126 which maps logical block addresses (LBAs) from the host to physical block addresses (PBAs) on the non-volatile memory device 120. Accordingly, the mapping component 604 may maintain a record of which MLC storage elements comprise upper pages that store the same data as the corresponding lower pages, e.g., "00" or "11".

As described above, the mapping, list, record, or the like that the mapping component 604 manages may be used to service a read request for the upper page from the lower page, and/or to read lower page data from the upper page if the lower page read fails, as explained in detail above, to determine if the upper page was programmed during a lower page program with data of the lower page program.

FIG. 7A is a diagram illustrating one embodiment of a voltage range for a storage cell. In one embodiment, FIG. 7A depicts the voltage range or distribution for an SLC storage cell such that there are two possible values that can be stored in the SLC storage cell, either a "1" 702 representing an erase state and a "0" 704 representing a programmed state. FIG. 7A also shows the read voltage threshold 710 for reading the value that is stored in the SLC storage cell, and the voltage threshold range 712 for the entire SLC storage cell. Because only two possible values can be stored in the SLC storage cell, the voltage distribution or range is wider than in MLC storage cells as depicted in FIGS. 7B and 7C. Thus, to represent a programmed state, e.g., a "0" 704 state, there is some latitude in the voltage that is set on the SLC storage cell to represent the "0" 704 value.

FIG. 7B is a diagram illustrating one embodiment of a voltage range for a storage cell. In one embodiment, FIG. 7B depicts the voltage range or distribution for an MLC storage cell such that there are four possible values that can be stored in the MLC storage cell, a "11" 702 representing an erase state, and a "01" 706, a "00" 704, and a "10" 708 representing the various programmed states of the MLC storage cell. In such an embodiment, two different read voltage thresholds 710, 714 are used to read the values from MLC storage cells. Each possible state 702, 704, 706, 708 are capable of storing two (or more) bits of data. In the depicted embodiment, two bits of data can be stored in each state 702, 704, 706, 708 with the bottom bit representing the lower page and the top bit representing the upper page of the MLC storage cell.

FIG. 7C is a diagram illustrating one embodiment of a voltage range for a storage cell. In one embodiment, the storage cell is an MLC storage cell that may have only had its lower page programmed, similar to the SLC storage cell illustrated in FIG. 7A. As described herein, when the MLC storage cell only has its lower page programmed, the page program component 150 may program the upper page corresponding to the programmed lower page with the same data as the lower page. For instance, instead of storing a single bit "0" or "1" in the MLC storage cell, the page program component 150 stores a "00" or a "11" such that the voltage distributions are set for the MLC storage cell as if the upper and lower pages were programmed during the same write request.

As explained above, programming the upper page during a lower page program, using data of the lower page program, ensures that the lower page data is not lost when a stand-alone upper page program is subsequently performed and fails. Furthermore, programming the upper page during a lower page program does not require the lower page data to be moved or backed-up to a scratchpad or other memory location prior to a subsequent stand-alone upper page program because the lower page data is assured be available even if the upper page program fails.

Figure 8:
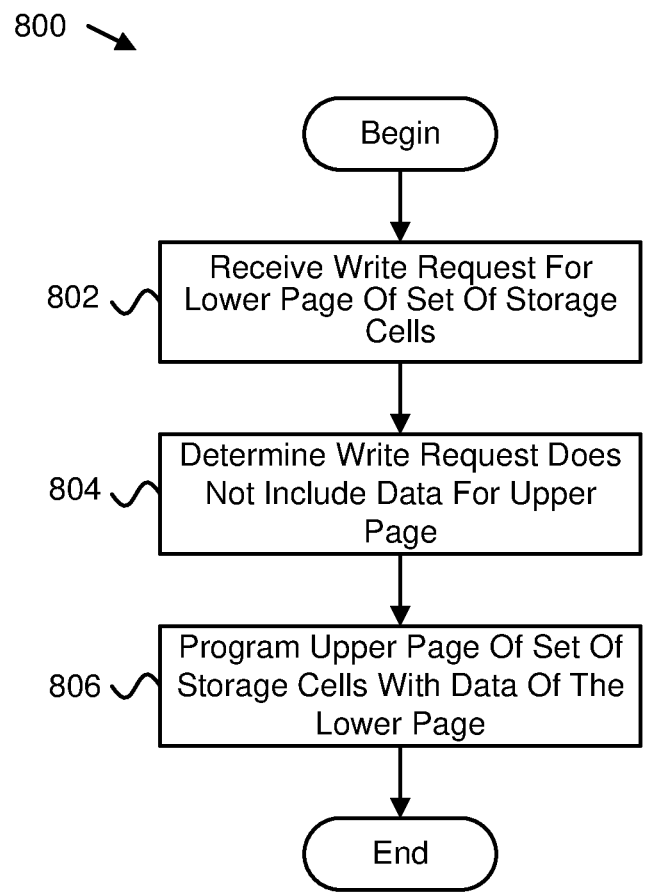
FIG. 8 is a schematic flow chart diagram illustrating one embodiment of a method for programming an unprogrammed upper page based on lower page programming.

FIG. 8 is a schematic flow chart diagram illustrating one embodiment of a method for programming an unprogrammed upper page based on lower page programming. In one embodiment, the method 800 begins and the data component 502 receives 802 a write request for at least a lower page of a set of MLC storage cells of the non-volatile storage device 120. The set of MLC storage cells may include at least a lower page and an upper page. In further embodiments, the page component 504 determines 804 that the write request does not comprise data for at least a portion of the upper page of the set of MLC storage cells. In certain embodiments, the write component 506 programs 806 the at least a portion of the upper page of the set of MLC storage cells with data of the at least a lower page of the set of MLC storage cells, and the method 800 ends.

Figure 9:
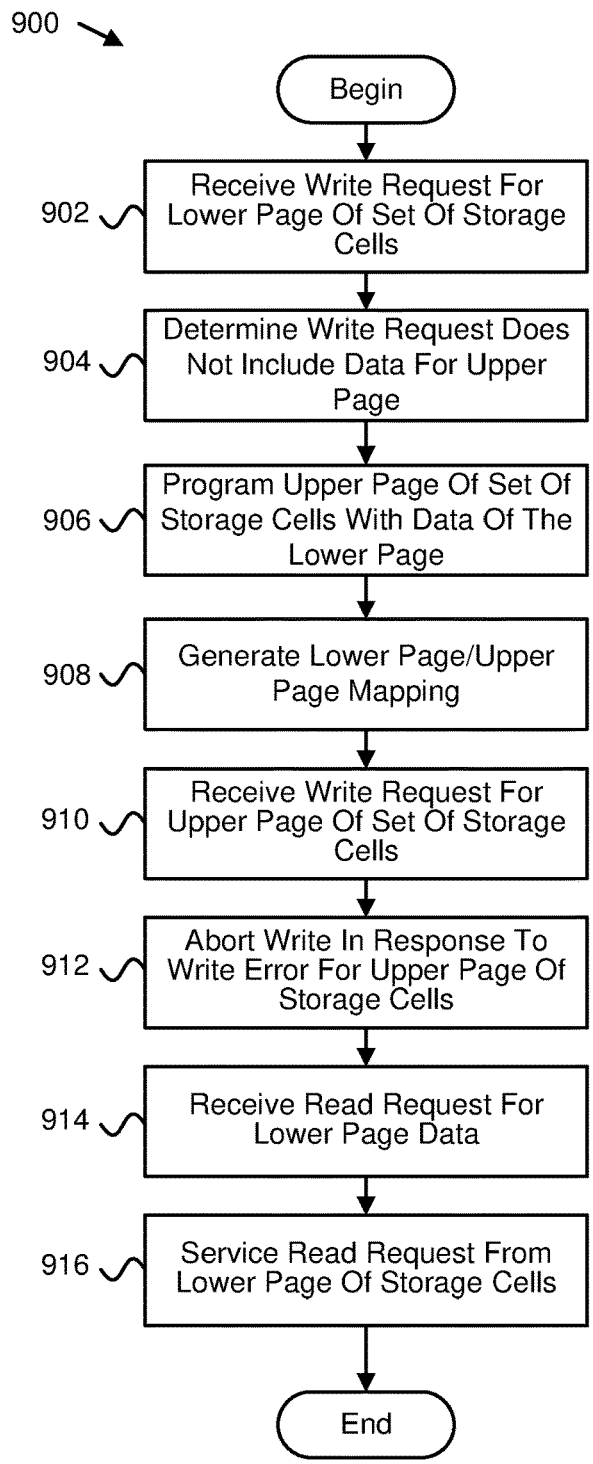
FIG. 9 is a schematic flow chart diagram illustrating one embodiment of another method for programming an unprogrammed upper page based on lower page programming.

FIG. 9 is a schematic flow chart diagram illustrating one embodiment of another method for programming an unprogrammed upper page based on lower page programming. In one embodiment, the method 900 begins and the data component 502 receives 902 a write request for at least a lower page of a set of MLC storage cells of the non-volatile storage device 120. The set of MLC storage cells may include at least a lower page and an upper page. In further embodiments, the page component 504 determines 904 that the write request does not comprise data for at least a portion of the upper page of the set of MLC storage cells. In certain embodiments, the write component 506 programs 906 the at least a portion of the upper page of the set of MLC storage cells with data of the at least a lower page of the set of MLC storage cells.

In one embodiment, the mapping component 604 generates 908 a mapping, list, data store, table, record, and/or the like of the set of MLC storage cells that have an upper page that was programmed at the same time, on in response to, the lower page of the set of MLC storage cells being programmed. In certain embodiments, the write component 506 receives 910 a write request for the upper page of the set of MLC storage cells. In some embodiments, the write component 506 aborts 912 the write operation in response to detecting a write error for the upper page of the set of MLC storage cells.

In certain embodiments, the read component 602 receives 914 a read request for data stored in the lower page of the set of MLC storage cells. The read component 602, in one embodiment, services 916 the read request from the lower page of storage cells even though the previous upper page program failed, and the method 900 ends.

Means for receiving first data of a write request for storage elements of a non-volatile storage medium include, in various embodiments, one or more of a page program component 150, a data component 502, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for receiving first data of a write request for storage elements of a non-volatile storage medium.

Means for determining that first data is sized such that at least a portion of the upper page of the storage elements is not programmed with at least a portion of the first data in response to programming the lower page of the storage elements with at least a portion of the first data include, in various embodiments, one or more of a page program component 150, a page component 504, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for determining that the first data is sized such that at least a portion of the upper page of the storage elements is not programmed with at least a portion of the first data in response to programming the lower page of the storage elements with at least a portion of the first data.

Means for programming at least a portion of an unprogrammed upper page of storage elements with second data include, in various embodiments, one or more of a page program component 150, a write component 506, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for programming at least a portion of an unprogrammed upper page of storage elements with second data.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. An apparatus comprising:
 a controller for a non-volatile storage device, the controller comprising:
   a data component configured to receive a write request for at least a lower page of a word line of multi-level storage cells of the non-volatile storage device, the word line of multi-level storage cells comprising at least the lower page and an upper page of the word line;
   a page component configured to determine that the write request does not comprise data for at least a portion of the upper page of the word line of multi-level storage cells; and
   a write component configured to program the at least a portion of the upper page of the word line of multi-level storage cells with data of the at least a lower page of the word line of multi-level storage cells during programming of the at least a lower page of the word line of multi-level storage cells.

2. The apparatus of claim 1, further comprising a read component configured to receive a read request for at least a portion of the lower the page of the word line of multi-level storage cells.

3. The apparatus of claim 2, wherein:
 the data component is further configured to receive a write request for at least a portion of the upper page of the word line of multi-level storage cells;
 the write component is further configured to detect that the write request for at least the portion of the upper page of the word line of multi-level storage cells failed; and
 the read component is further configured to service a read request for the at least a portion of the lower page of the word line of multi-level storage cells even though the write request for the upper page of the word line of multi-level storage cells failed.

4. The apparatus of claim 2, wherein the read component is further configured to:
 receive a read request for at least a portion of the upper page of the word line of multi-level storage cells;
 determine that at least a portion of the lower page of the word line of multi-level storage cells that corresponds to the at least a portion of the upper page of the word line of multi-level storage cells of the read request comprises the same values as the corresponding at least a portion of the upper page of the word line of multi-level storage cells; and
 service the read request for the at least a portion of the upper page of the word line of multi-level storage cells from the at least a portion of the lower page of the word line of multi-level storage cells that corresponds to the at least a portion of the upper page of the word line of multi-level storage cells.

5. The apparatus of claim 2, wherein the read component is further configured to:
 determine that the read request for the at least a portion of the lower page of the word line of multi-level storage cells failed;
 determine that the values for at least a portion of the upper page of the word line of multi-level storage cells that corresponds to the at least a portion of the lower page of the word line of multi-level storage cells comprises the same values as the at least a portion of the lower page of the word line of multi-level storage cells; and
 service the read request for the at least a portion of the lower page of the word line of multi-level storage cells from the at least a portion of the upper page of the word line of multi-level storage cells that corresponds to the at least a portion of the lower page of the word line of multi-level storage cells.

6. The apparatus of claim 1, wherein the write component is further configured to:
  receive a write request for the at least a portion of the upper page of the word line of multi-level storage cells; and
  service the write request for the at least a portion of the upper page of the word line of multi-level storage cells without backing-up the data in the at least a portion of the lower page of the word line of multi-level storage cells prior to servicing the write request for the at least a portion of the upper page of the word line of multi-level storage cells.

7. The apparatus of claim 1, further comprising a mapping component configured to maintain a mapping of multi-level storage cells of the at least a portion of the upper page of the word line that are programmed with data of the lower page of the word line at the same time as the multi-level storage cells of the at least a portion of the lower page of the word line in response to the write request for the lower page of the word line of the at least a portion of the multi-level storage cells of the lower page of the word line.

8. The apparatus of claim 7, wherein the mapping component maintains the mapping in metadata for the non-volatile storage device.

9. The apparatus of claim 1, wherein the write component programs the at least a portion of the upper page of the word line of the multi-level storage cells with the same data as the corresponding at least a portion of the lower page of the word line of the multi-level storage cells.

10. The apparatus of claim 1, wherein at least a portion of the data component, the page component, and the write component comprise one or more of hardware circuits, programmable hardware devices, and executable code, the executable code stored on one or more non-transitory computer readable storage media.

11. An apparatus comprising:
  means for receiving first data of a write request for a word line of a non-volatile storage medium, the word line comprising a lower page and an upper page;
  means for determining that the first data is sized such that at least a portion of the upper page of the word line is not programmed with at least a portion of the first data in response to programming the lower page of the word line with at least a portion of the first data; and
  means for programming the at least a portion of the unprogrammed upper page of the word line with at least a portion of the first data during programming of the lower page of the word line with the first data.

12. The apparatus of claim 11, further comprising means for receiving a read request for at least a portion of the lower page of the word line.

13. The apparatus of claim 12, further comprising:
  means for receiving a write request for at least a portion of the upper page of the word line;
  means for detecting that the write request for at least the portion of the upper page of the word line failed; and
  means for servicing the read request for the at least a portion of the lower page of the word line even though the write request for the upper page of the word line failed.

14. The apparatus of claim 12, further comprising:
  means for receiving a read request for at least a portion of the upper page of the word line;
  means for determining that at least a portion of the lower page of the word line that corresponds to the at least a portion of the upper page of the word line of the read request comprises the same values as the corresponding at least a portion of the upper page of the word line; and
  means for servicing the read request for the at least a portion of the upper page of the word line from the at least a portion of the lower page of the word line that corresponds to the at least a portion of the upper page of the word line.

15. The apparatus of claim 12, further comprising:
  means for determining that the read request for the at least a portion of the lower page of the word line failed;
  means for determining that the values for at least a portion of the upper page of the word line that corresponds to the at least a portion of the lower page of the word line comprises the same values as the at least a portion of the lower page of the word line; and
  means for servicing the read request for the at least a portion of the lower page of the word line from the at least a portion of the upper page of the word line that corresponds to the at least a portion of the lower page of the word line.

16. The apparatus of claim 11, further comprising:
  means for receiving a write request for the at least a portion of the upper page of the word line; and
  means for servicing the write request for the at least a portion of the upper page of the word line without backing-up the first data in the at least a portion of the lower page of the word line prior to servicing the write request for the at least a portion of the upper page of the word line.

17. The apparatus of claim 11, further comprising means for maintaining a mapping of storage cells of the word line where the same at least a portion of the first data was programmed to both the upper page and the lower page of the word line in response to the write request for the lower page of the word line.

18. The apparatus of claim 17, wherein the mapping component maintains the mapping in metadata for the non-volatile storage device.

19. A system comprising:
  a non-volatile memory device, the non-volatile memory device comprising a plurality of word lines of memory cells; and
  a controller for the non-volatile memory device, the controller performing operations for:
    programming a lower page of a word line of the plurality of word lines of the non-volatile memory device with data of a write request;
    determining at least a portion of memory cells of the word line where an upper page of the word line is not programmed with the data and where the lower page of the word line is programmed with the data; and
    programming the at least a portion of the upper page of the word line with the same data used to program the corresponding lower page of the word line.

* * * * *